(12) United States Patent
Falconer

(10) Patent No.: US 6,577,179 B2
(45) Date of Patent: Jun. 10, 2003

(54) DYNAMIC LINE TERMINATION WITH SELF-ADJUSTING IMPEDANCE

(75) Inventor: Maynard C. Falconer, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/440,494

(22) Filed: Nov. 15, 1999

(65) Prior Publication Data

US 2002/0070784 A1 Jun. 13, 2002

(51) Int. Cl.[7] ............................................... H02J 3/38
(52) U.S. Cl. ..................... 327/530; 327/362; 326/30; 333/17.3
(58) Field of Search .............................. 327/276, 278, 327/281, 309, 362, 530; 326/30, 83; 333/17.3

(56) References Cited

U.S. PATENT DOCUMENTS 5,231,319 A * 7/1993 Crafts et al. ............... 327/277
5,296,756 A    3/1994 Patel et al. ................. 307/443
5,446,417 A * 8/1995 Korhonen et al. ............ 331/57
5,459,424 A * 10/1995 Hattori ...................... 327/278
5,559,441 A    9/1996 Desroches .................. 324/647
5,760,601 A    6/1998 Frankeny ..................... 326/30
5,811,984 A    9/1998 Long et al. ................... 326/30
5,850,305 A * 12/1998 Pidgeon ..................... 359/187
5,905,403 A * 5/1999 Gillette ...................... 327/540
6,184,665 B1 * 2/2001 Salina et al. ................ 323/282

* cited by examiner

Primary Examiner—Terry D. Cunningham
Assistant Examiner—Quan Tra
(74) Attorney, Agent, or Firm—Kenyon & Kenyon

(57) ABSTRACT

A method of adjusting a circuit operating characteristic. The method includes generating a first signal for application to a reference termination. The method then includes generating a first voltage based on the first signal at a first point on the reference termination and generating a second voltage based on the first signal at a second point on the reference termination. The method also includes adjusting an operating characteristic based upon the first voltage and the second voltage. In an embodiment, the operating characteristic can be an impedance.

19 Claims, 9 Drawing Sheets

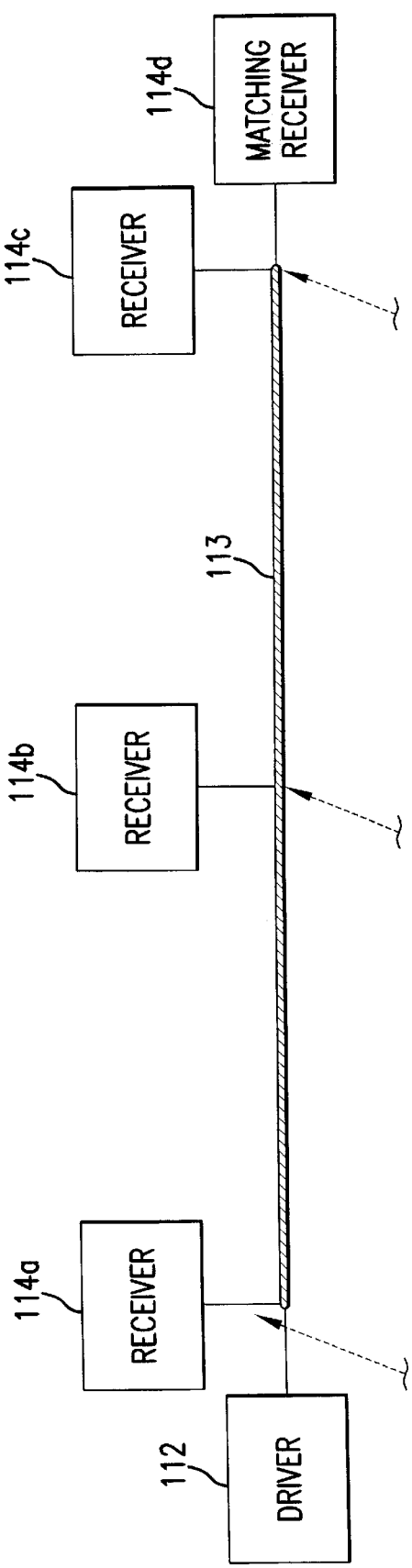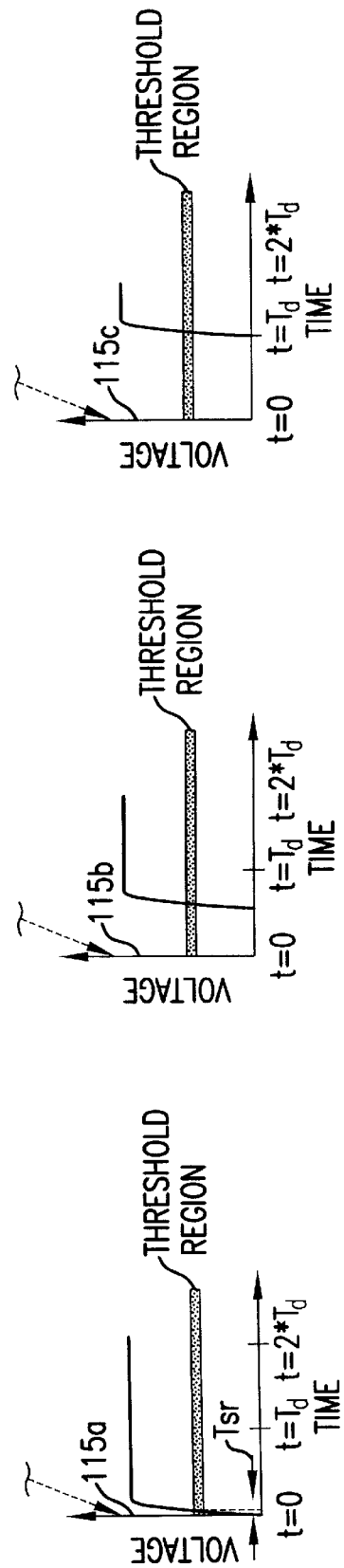
FIG.1C
FIG.1D

DYNAMIC LINE TERMINATION WITH SELF-ADJUSTING IMPEDANCE

FIELD OF THE INVENTION

The present invention pertains to the field of impedance control. More particularly, the present invention pertains to adjustment of a circuit impedance relative to a transmission line impedance.

BACKGROUND OF THE INVENTION

The impedance of a driver and receiver relative to the impedance of a transmission line has a significant impact on the efficiency and reliability of communications across the line. For example, integrated circuit chips (IC's) are increasingly operating at such high frequencies that the signal leads and interconnecting traces between chips behave like transmission lines rather than lumped capacitors. The transmission lines have a characteristic impedance ($Z_o$) which needs to be considered for efficient and reliable transmission across the line. A driver transmitting signals through a transmission line to a receiver or multiple receivers can be plagued by a variety of problems.

For example, multiple reflections due to impedance mismatches at the driver-transmission line interface and the receiver-transmission line interface(s) can cause errors in decoding the signal received at the receiver. These errors can be due to signal integrity factors, such as monotonicity, overshoot, ringback, and long settling times which may impact the signal flight time.

While impedance mismatch creates problems, matching the impedance at the driver-transmission line interface has its own drawback, as well. For example, matching the driver impedance to the transmission line impedance may result in the signal having a large rise time due to the relatively high resistance-capacitance (RC) time constant formed by the driver impedance and the driver output capacitance. Large rise times are undesirable for several reasons, including the increased susceptibility to noise during the time needed for the signal to reach the threshold region of the receiver, and increased driver switching times.

Adjusting the impedance at the driver or the receiver relative to the line impedance is important for controlling the performance across a transmission line. The performance of an IC chip is significantly affected by the impedance of the driver and the receiver. The switching times, number and strength of reflections, and switching quality are a function of the impedance of the driver and the receiver relative to the transmission line impedance. Since decreased switching times, fewer and weaker reflections, and acceptable signal quality would improve performance, it would be advantageous to control impedance so as to achieve relatively lower switching times while still achieving acceptable signal quality.

SUMMARY OF THE INVENTION

According to an embodiment of the invention a method of adjusting a circuit operating characteristic is described. For one embodiment, the circuit operating characteristic can be an impedance. The method includes generating a first signal for application to a reference termination. The method then includes generating a first voltage based on the first signal at a first point on the reference termination and generating a second voltage based on the first signal at a second point on the reference termination. The method also includes adjusting an operating characteristic based upon the first voltage and the second voltage.

BRIEF DESCRIPTION OF THE DRAWINGS

The present invention is illustrated by way of example, and not limitation, in the figures of the accompanying drawings in which:

FIG. 1c illustrates a communications line in an embodiment in accordance with the present invention;

FIG. 1d illustrates timing diagrams for a communications line in an embodiment in accordance with the present invention;

DETAILED DESCRIPTION

A method and apparatus for adjusting impedance is described. In the following description, for purposes of explanation, numerous specific details are set forth in order to provide a thorough understanding of the present invention. It will be evident, however, to one skilled in the art that the present invention may be practiced in any integrated circuit, especially processors, without these specific details. In other instances well known operations, functions and devices are not shown in order to avoid obscuring the invention.

Figure 1A:
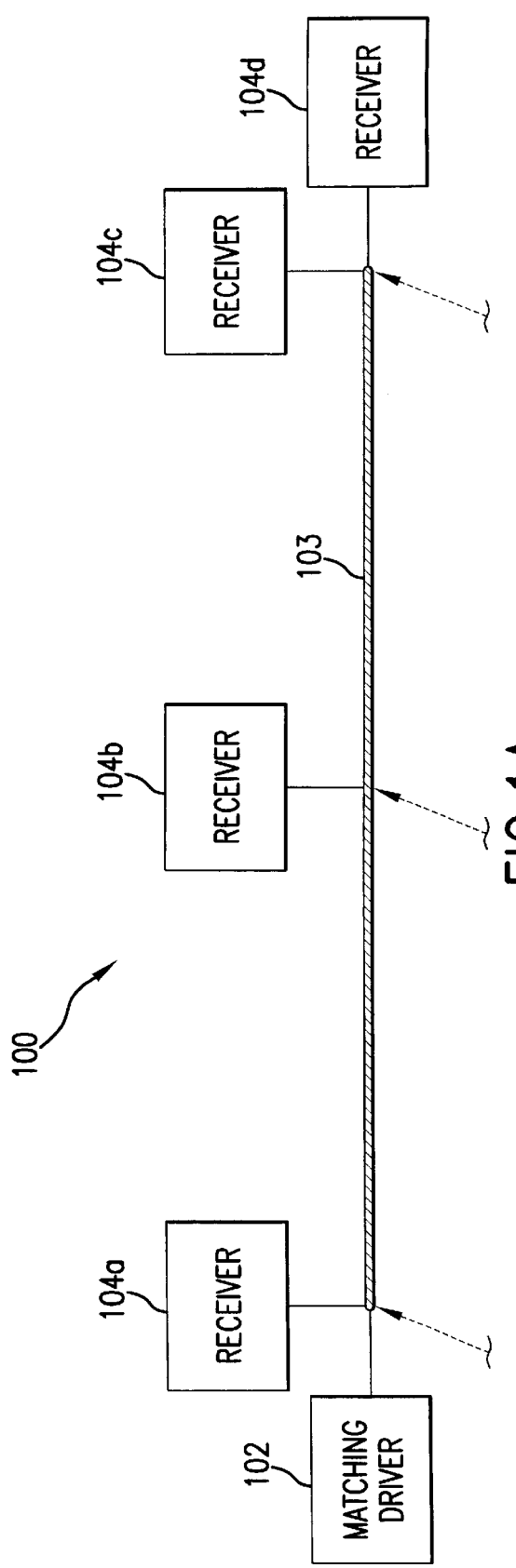
FIG. 1a illustrates a communications line.

Referring to FIG. 1a, a block diagram of a communications line 100 is illustrated. Communications line 100 includes driver 102, line 103, receiver 104a, receiver 104b, receiver 104c, and receiver 104d. Driver 102 has an impedance that matches (i.e., is substantially equal to) the impedance of line 103. The fact that the impedances of driver 102 and line 103 are substantially equal has a significant impact on the performance of communications line 100. The performance of communications line 100 is depicted in the ti diagrams of FIG. 1b which illustrate timing diagrams for a communication line having a driver whose impedance matches the line impedance. Timing diagram 105a depicts a signal measured at the driver 102-line 103 interface. Because the impedance of driver 102 matches the impedance of line 103, the signal measured at the driver-line interface has a large rise time (Tlr). The large rise time is due to the large resistance-capacitance (RC) time constant formed by the driver impedance and driver output capacitance. Large rise times are undesirable for several reasons. For example, a large rise time means that signal will take a long time to reach and cross the threshold region of a receiver. Since the receiver is able to detect and decode a signal properly only after it has crossed the threshold region, having the signal spend a long time reaching the threshold region affects the data rate of the signal and the throughput of communications line 100. Additionally, a long rise time increases the window of opportunity for noise and the affect noise can have on a receiver's ability to decode and detect a signal properly. Timing diagram 105b depicts the signal measured at receiver 104b. Timing diagram 105c depicts the signal measured at receiver 104c or 104d. The signal shown in diagram 105c illustrates the effect of reflection at the receiver 104d-line 103 interface. Due to the reflection of the transmitted signal, the transmitted signal adds up with the reflected signal such that the sum of the two signals clearly crosses the threshold region at receiver 104c shortly after time Td+Tlr. Td refers to the time it takes for the signal to travel from driver 102 to receiver 104d. Tlr refers to the time it takes the signal to reach the threshold region. After the signal reaches receiver 104d a reflected signal travels back towards driver 102. At receiver 104b, the reflected signal adds up with the transmitted signal such that the sum of the two signals clearly crosses the threshold region at receiver 104b shortly after time 1.5 Td. At receiver 104a, the reflected signal adds up with the transmitted signal such that the sum of the two signals clearly crosses the threshold region at receiver 104a shortly after time 2 Td+Tlr. It is apparent from diagram 105a that the signal does not rise appreciably above the threshold level sometime after 2 Td. Consequently, receivers 104a, 104b, and 104c do not all observe the same signal level until sometime after 2*Td.

Referring to FIG. 1c, a block diagram for a communications line in accordance with the present invention is illustrated. Communications line 110 includes driver 112, line 113, receiver 114a, receiver 114b, receiver 114c, and receiver 114d. Driver 112 has an impedance that is substantially lower than the impedance of line 113. The fact that the impedance of driver 112 is less than the impedance of line 113 has a significant impact on the performance of communications line 110. The performance of communications line 110 is depicted in the timing diagrams of FIG. 1d which illustrate timing diagrams for a communication line having a driver whose impedance is less than the line impedance. Timing diagram 115a depicts a signal measured at the driver 112-line 113 interface. Because the impedance of driver 112 is relatively small compared to the impedance of line 113, the signal measured at the driver-line interface has a small rise time (Tsr). The small rise time is due to the relatively small resistance-capacitance (RC) time constant formed by the driver impedance and driver output capacitance. Small rise times are desirable for several reasons. For example, a small rise time means that signal will take a relatively short time to reach and cross the threshold region of a receiver. Since the receiver is able to detect and decode a signal properly only after it has crossed the threshold region, having the signal spend a short time to reach the threshold region affects favorably the data rate of the signal and the throughput of communications line 110. Additionally, a short rise time decreases the window of opportunity and the affect noise can have on a receiver's ability to decode and detect a signal properly. Timing diagrams 115a, 115b, and 115c depict the signal measured at receiver 114a, 114b, and 114c or 114d, respectively. The signals shown in diagrams 115b and 115c have substantially the same rise time as the signal shown in diagram 115a. Consequently, by time Td, all of the receivers along communications line 110 observe the same signal level that relatively unambiguously and quickly crosses the threshold region. In contrast, the receivers of communications line 100 of FIG. 1a do not observe the same signal level until sometime after 2 Td.

Figure 1B:
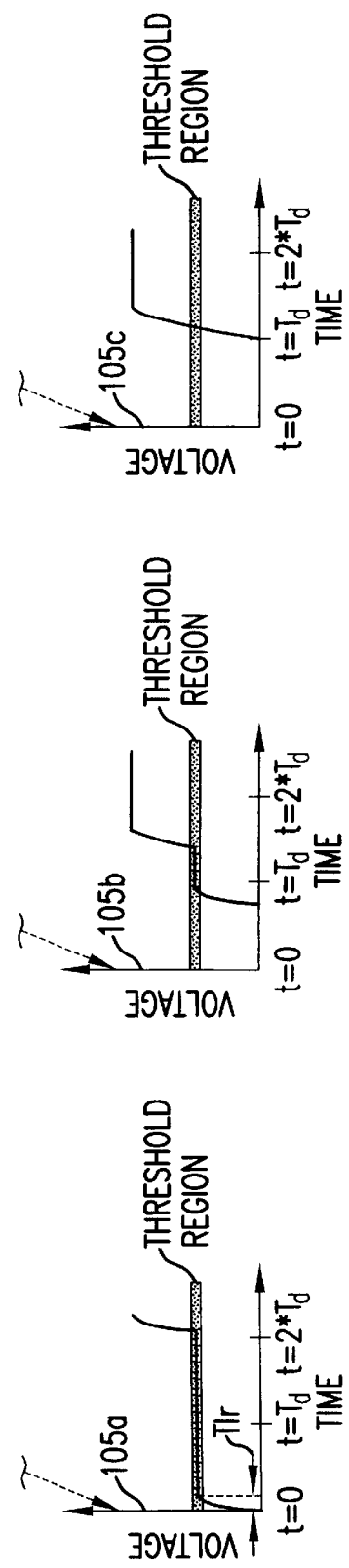
FIG. 1b illustrates timing diagrams for a communications line.

The improved performance depicted in FIG. 1d relative to the performance depicted in FIG. 1b is due to the relatively low impedance of driver 112 and the substantially matching impedances of receiver 114d and line 113. By having a low impedance at the driver relative to the impedance of line 113, the output voltage of driver 112 falls mostly on line 113 rather than on the output impedance of driver 112. For example, if the line impedance is 50 ohms, the output impedance of driver 112 is 8 ohms and the output voltage of the driver is 5 volts, the voltage impressed on the line will be 4.31 volts. Consequently, the signal put out by driver 112 will be large enough to unambiguously cross a threshold at 2.5 volts, and there is no need for a reflection from receiver 114d to combine with the signal put out by driver 112 in order for the sum to cross the threshold. Since there is no need for a reflection, the impedances for receiver 114d and line 113 can substantially match.

Figure 2A:
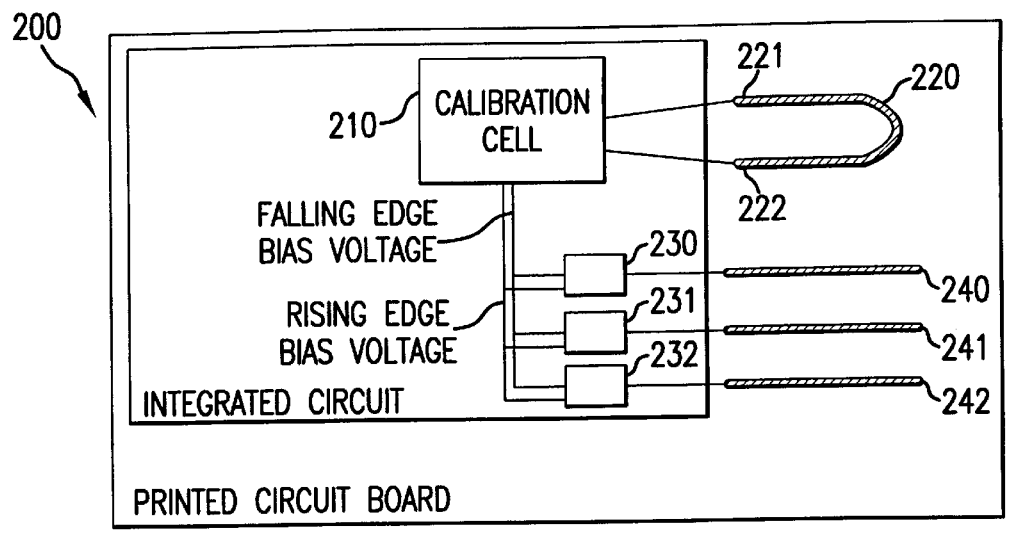
FIG. 2a is a block diagram of an impedance control circuit including a calibration cell in one embodiment in accordance with the present invention.
Figure 2B:
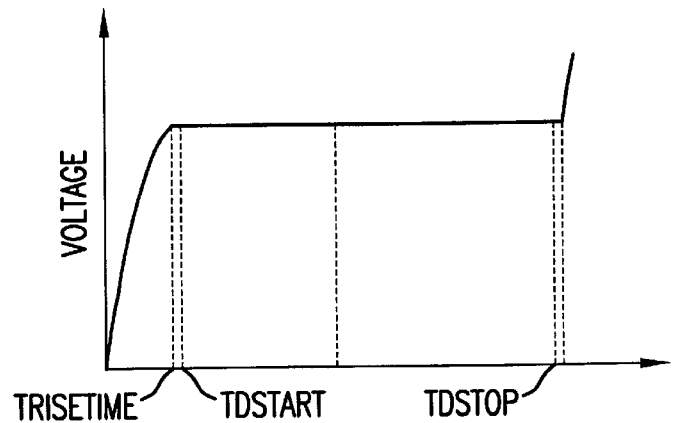
FIG. 2b illustrates a timing diagram for a calibration signal in an embodiment in accordance with the present invention.
Figure 2C:
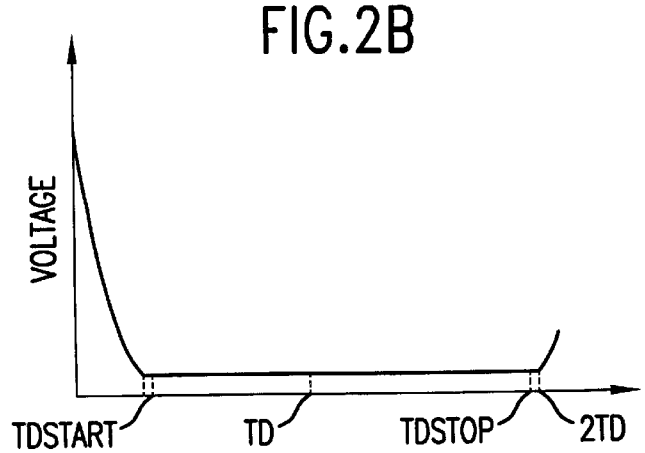
FIG. 2c illustrates a timing diagram for another calibration signal in an embodiment in accordance with the present invention.

FIG. 2a illustrates an impedance control circuit including a calibration cell in accordance with one embodiment of the present invention. Control circuit 200 includes a calibration cell 210 coupled to a printed circuit board trace (PCB trace) 220 and to termination cells 230–232. Circuit 200 also includes transmission lines 240–242. Termination cells 230–232 receive signals via lines 240–242, respectively. PCB trace 220 includes an input 221 and an output 222. Calibration cell 210 generates a calibration signal for application to input 221. Examples of calibration signals that may be generated by cell 210 in accordance with an embodiment of the present invention are shown in FIG. 2b (rising edge signal) and FIG. 2c (falling edge signal). Depending on the implementation, it should be apparent to one of ordinary skill in the art that other calibration signals are possible. The case where a rising edge signal is is described first. The rising edge signal travels through PCB trace 220 and emerges from output 222. Cell 210 integrates the rising edge signal applied to input 221 to generate an input voltage, and integrates the signal that emerges from output 222 to generate an output voltage. Cell 210 compares the input voltage and output voltage and uses the result of the comparison to generate a rising edge bias voltage which is applied to termination cells 230–232. Cell 210 repeats the procedure described above using a falling edge signal. For a falling edge signal used as a calibration signal, cell 210 generates a falling edge bias voltage. The rising edge bias voltage and the falling edge bias voltage are used to adjust the impedance of termination fcells 230–232 such that the impedance of termination cells 230–232 matches the impedance of lines 240–242, respectively.

When a rising edge signal is received at a termination cell, the rising edge bias voltage causes the impedance of the termination cell to substantially match the impedance of the transmission line during the rising edge signal. When a falling edge signal is received at a termination cell, the falling edge bias voltage causes the impedance of the termination cell to substantially match the impedance of the transmission line during the rising edge signal. The adjustment of the impedance of termination cells using the bias voltages is described in greater detail below.

While in the above description PCB trace 220 is a loop on a printed circuit board, in an alternative embodiment a precision reference such as an external resistor may be used. A benefit of using a PCB trace is the ability to adjust the impedance in a manner that takes into account the circuit board process variations in addition to the process variations that occur in manufacturing a chip. While in the above description cell 210 generates two bias voltages, in an alternative embodiment in accordance with the present invention a calibration cell such as cell 210 may generate fewer or more bias voltages. Additionally, while in the above description the termination cells are on an integrated circuit, it should be apparent to one of ordinary skill in the art that the present invention may also be practiced with discrete components such as transistors, capacitors, inductors, and resistors. In alternative embodiments, the number of termination cells may be fewer or more than the three cells illustrated in FIG. 2a. Similarly the number of transmission lines may be fewer or more than the three lines illustrated in FIG. 2a. While in the above description, the termination cell receives a signal (i.e., includes a receiver buffer), in an alternative embodiment the termination cell may include a driver.

Figure 3A:
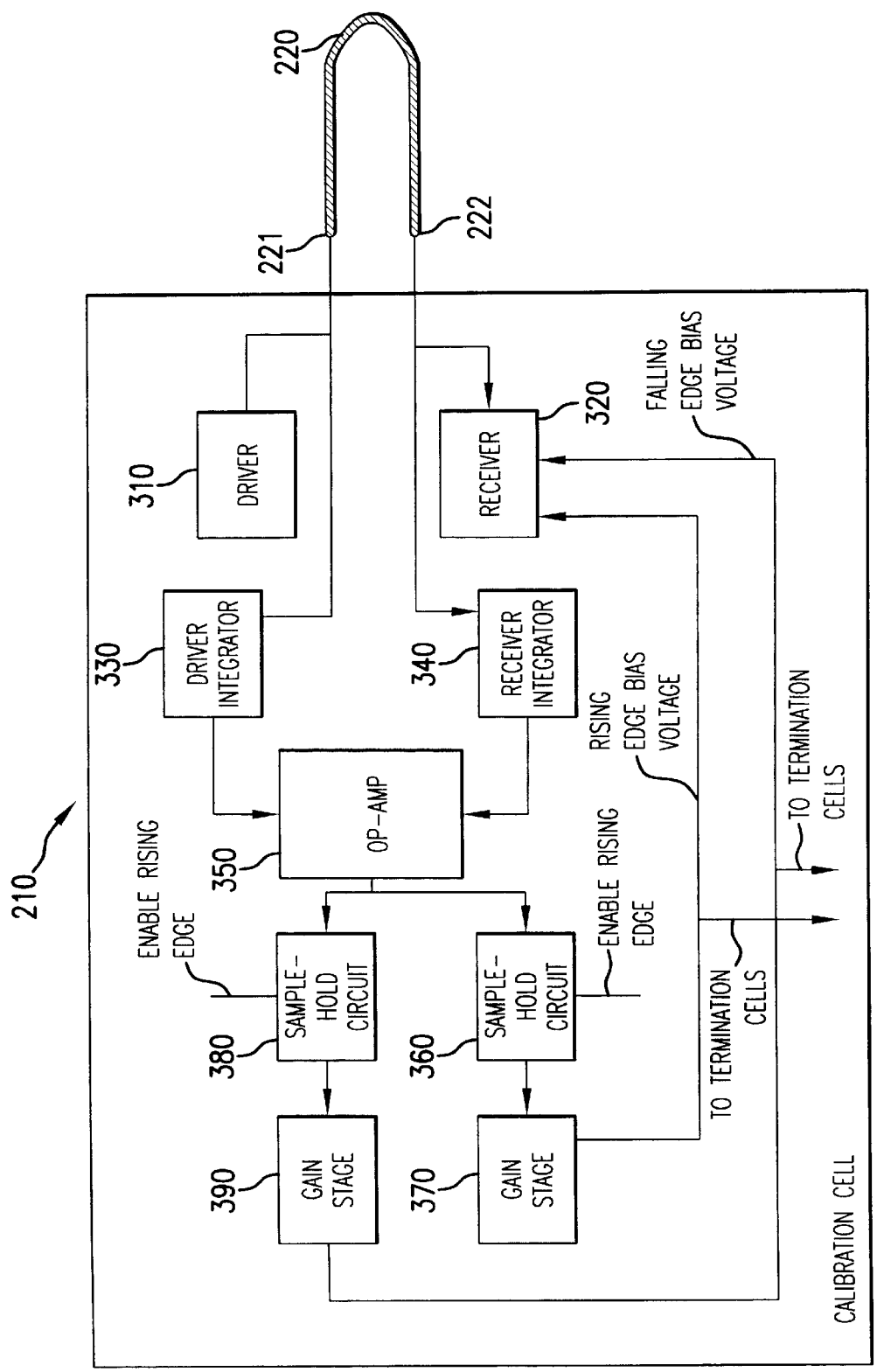
FIG. 3a is a block diagram of a calibration cell in an embodiment in accordance with the present invention.
Figure 3B:
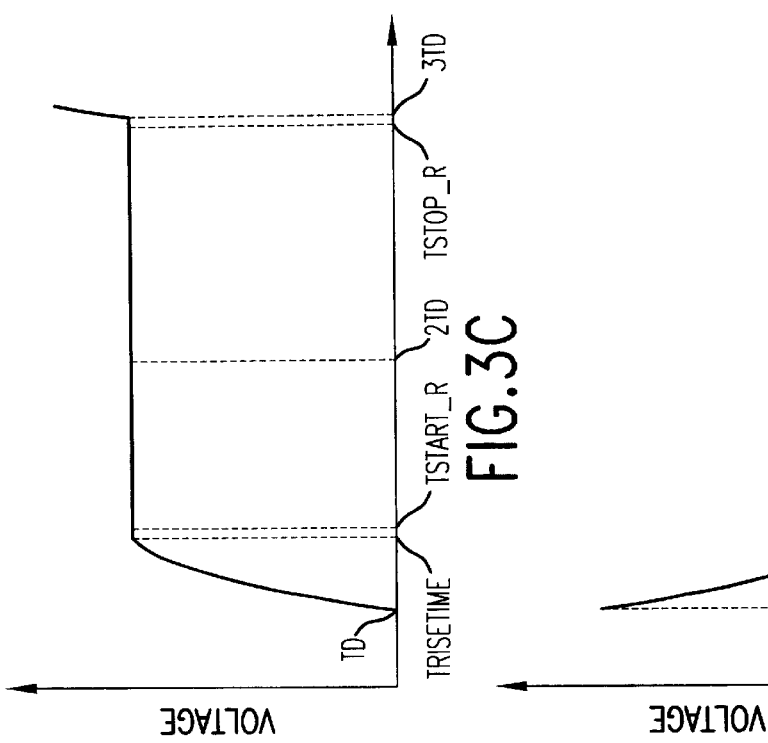
FIG. 3b illustrates a timing diagram for a calibration signal in an embodiment in accordance with the present invention.
Figure 3C:
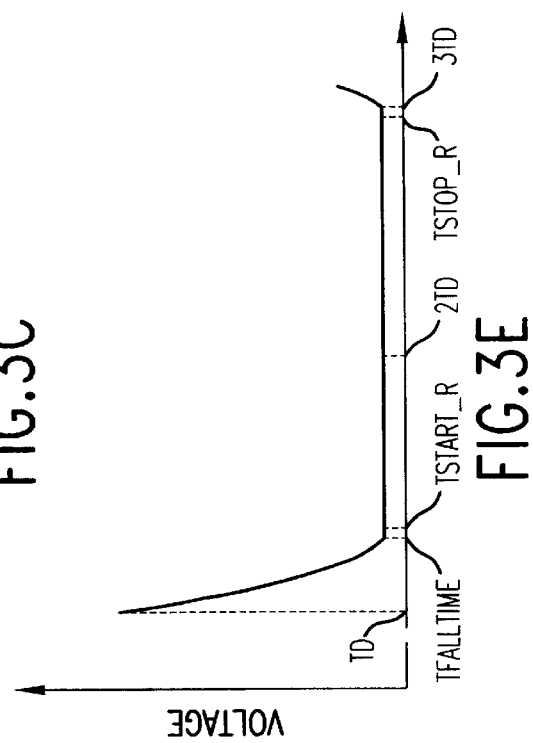
FIG. 3c illustrates another timing diagram for a calibration signal in an embodiment in accordance with the present invention.

FIG. 3a illustrates in greater detail a calibration cell in accordance with an embodiment of the present invention. Calibration cell 210 includes a driver 310, receiver 320, driver integrator 330, receiver integrator 340, an op-amp 350, a sample and hold circuit 360, a gain stage 370, a sample and hold circuit 380, and a gain stage 390. Driver 310 generates a rising edge signal such as the one illustrated in FIG. 3b for application to PCB trace 220. FIG. 3b illustrates a signal generated in accordance with an embodiment of the present invention. Driver integrator 330 integrates the signal between time Tstart_d and Tstop_d, a time window less than the roundtrip flight time of the signal through PCB trace 220. Tstart_d can be anytime after time Trisetime and before Tstop_d, where Tstop_d is be before 2*Td. Driver integrator 330 generates an input voltage based upon the integration of the signal between time Tstart_d and Tstop_d. Referring to FIG. 3c, at time Tstart_r, receiver integrator 340 starts integrating the signal illustrated in FIG. 3c after the signal emerges from PCB trace 220. FIG. 3c illustrates a timing diagram for a calibration signal in accordance with an embodiment of the present invention. The calibration signal of FIG. 3c is referred to herein as a rising edge signal. Receiver integrator 340 integrates until time Tstop_r, such that the difference between Tstop_r and Tstart_r is less than the roundtrip flight time of the signal through PCB trace 220. Tstart_r can be anytime after Td+Trisetime and before Tstop_r, where Tstop_r is less than 3*Td. Receiver integrator 340 generates an output voltage based upon the integration of the signal between time Tstart_r and Tstop_r. Op-amp 350 compares the output voltage and the input voltage and generates a difference signal indicative of the difference between the input voltage and the output voltage for application to sample and hold circuit 360. Sample and hold circuit 360 receives a rising edge enable signal from control logic (not shown in order not to obscure the invention) causing sample and hold circuit 360 to sample the difference signal and store the sample. Sample and hold circuit 360 then drives gain stage 370 with the sample. Based upon the sample, gain stage 370 generates a rising edge bias voltage which is applied to receiver 320. The bias voltage is used to adjust the input impedance of receiver 320 when rising edge signals are received. After adjusting the input impedance of receiver 320, another signal is generated and integrated by integrators 330 and 340 to produce another difference signal and bias voltage. Depending on the implementation, several integrations may be necessary before the difference signal is less than a predetermined value, indicating that the rising edge bias voltage is such that the receiver input impedance substantially matches the impedance of PCB trace 220 when a rising edge signal is placed on trace 220.

Figure 3D:
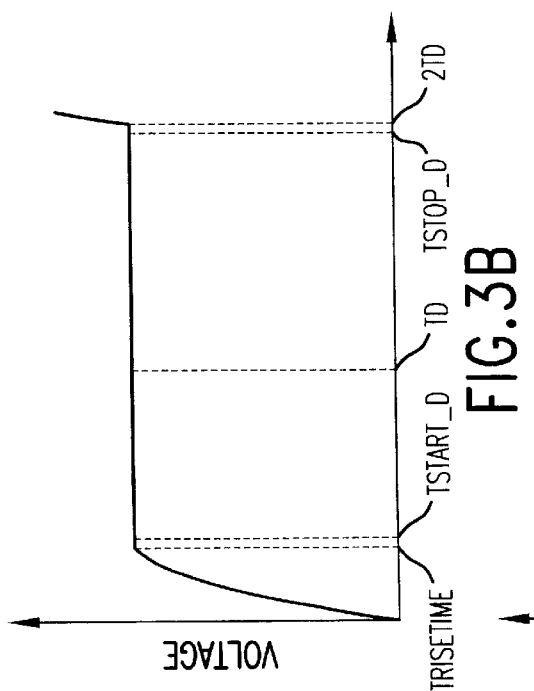
FIG. 3d illustrates a timing diagram for another calibration signal in an embodiment in accordance with the present invention.
Figure 3E:
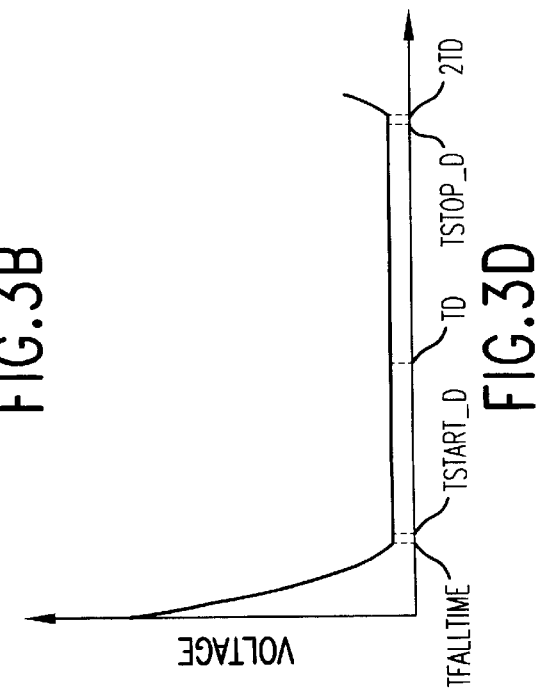
FIG. 3e illustrates another timing diagram for another calibration signal in an embodiment in accordance with the present invention.
Figure 4:
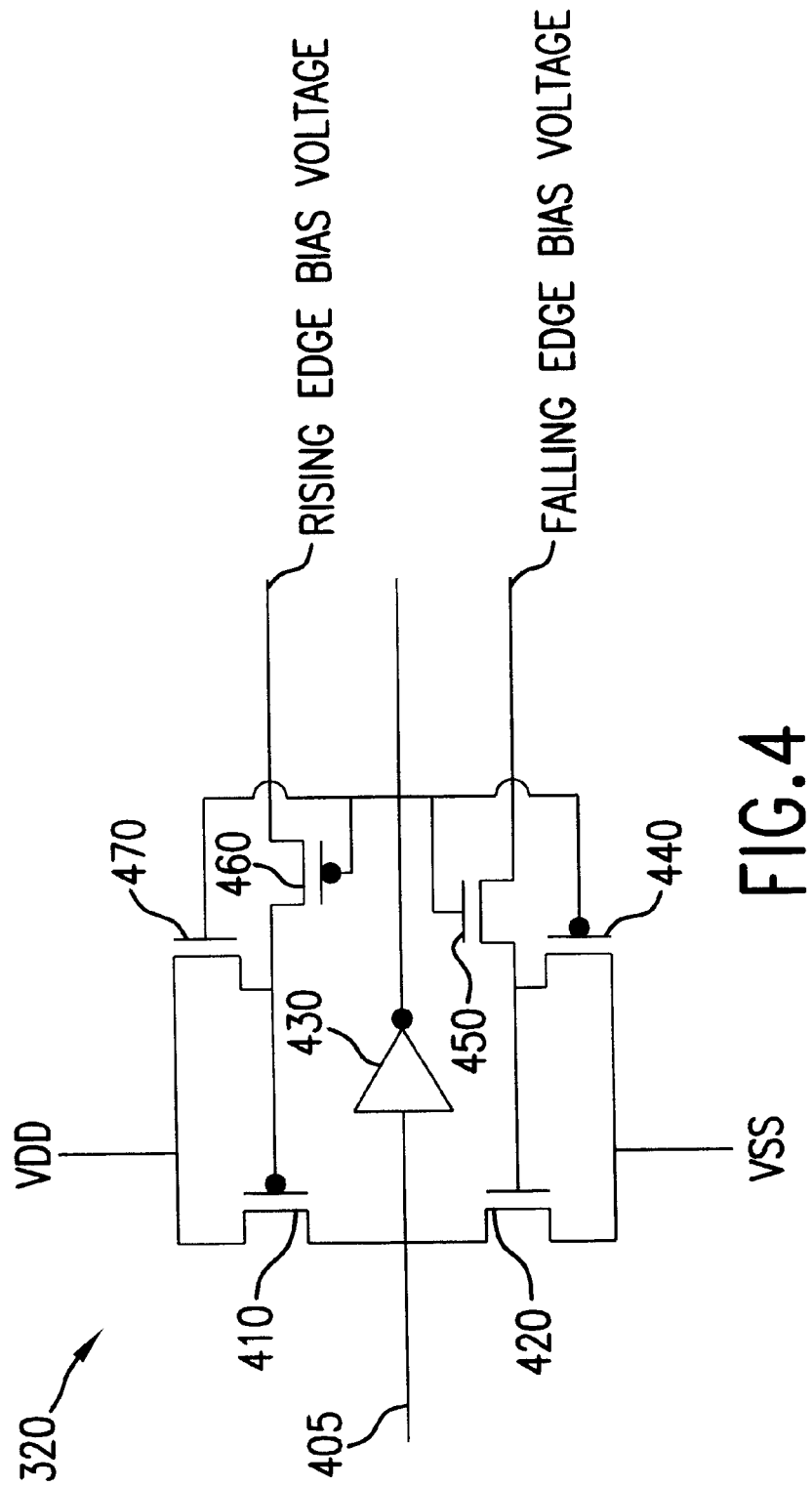
FIG. 4 illustrates a receiver according to an embodiment in accordance with the present invention.

While in the above description, a rising edge signal such as the one illustrated in FIG. 3b is used to generate a rising edge bias voltage, falling edge signals such as the ones illustrated in FIG. 3d (calibration signal at the driver) and FIG. 3e (calibration signal at the receiver) are also used to generate another bias voltage. FIG. 3d illustrates a timing diagram for another calibration signal in an embodiment in accordance with the present invention. FIG. 3e illustrates another timing diagram for another calibration signal in an embodiment in accordance with the present invention. A bias voltage generated using a falling edge signal is referred to herein as a falling edge bias voltage. Generation of a falling edge bias voltage will now be described. Driver 310 generates a falling edge signal with is integrated by integrators 330 and 340 to generate an input voltage and an output voltage, respectively. Op-amp 350 generates a difference signal based upon the input voltage and the output voltage. Sample and hold circuit 380 receives a falling edge enable signal from control logic (not shown in order not to obscure the invention) causing sample and hold circuit 380 to sample the difference signal and store the falling edge sample. Sample and hold circuit 380 then drives gain stage 390 with the falling edge sample. Based upon the falling edge sample, gain stage 390 generates a falling edge bias voltage which is applied to receiver 320. The falling edge bias voltage is used to adjust the input impedance of receiver 320 when falling edge signals are received at receiver 320. After adjusting the input impedance of receiver 320, another falling edge signal is generated and integrated by integrators 330 and 340 to product another difference signal and bias voltage. Depending on the implementation, several integrations may be necessary before the difference signal is less than a predetermined value, indicating that the falling edge bias voltage is such that FIG. 4 illustrates a receiver in accordance with an embodiment of the present invention. Receiver 320 of FIG. 3a is shown in greater detail in FIG. 4. Receiver 320 is also representative of termination cells 230–232 of FIG. 2a. Receiver 320 includes an input signal line 405, pull-up transistor 410, a pull-down transistor 420, an inverting receiver buffer 430, a negative isolation transistor 440, a falling edge bias voltage pass transistor 450, a rising edge bias voltage pass transistor 460, and a positive isolation transistor 470. The operation of receiver 320 of will now be described for the case where the input signal is a high voltage signal. The output of inverting buffer 430 will be a low voltage. The low voltage turns on transistor 440 causing the gate of transistor 420 to be pulled towards system ground, Vss, thereby turning off transistor 420 and preventing transistor 420 from pulling the input signal line down to system ground, Vss. The low voltage output by buffer 430 turns off transistor 450 substantially preventing the falling edge bias voltage from reaching transistor 420.

The low voltage output by buffer 430 also turns off transistor 470 preventing the supply voltage from being coupled to the gate of transistor 410. The low voltage output by buffer 430 turns on transistor 460 causing the rising edge bias voltage to be coupled to the gate of transistor 410. Depending upon the magnitude of the rising edge bias voltage applied to the gate of transistor 410, the impedance of transistor 410 can be adjusted. By adjusting the impedance of transistor 410, the input impedance of receiver 320 can be adjusted for rising edge signals.

The operation of receiver 320 of will now be described for the case where the input signal is a low voltage signal. The output of inverting buffer 430 will be a high voltage. The high voltage output by buffer 430 turns on transistor 470 allowing the supply voltage to be coupled to the gate of transistor 410, thereby substantially turning off transistor 410. The high voltage output by buffer 430 turns off transistor 460 preventing the rising edge bias voltage from being coupled to the gate of transistor 410.

The high voltage turns off transistor 440 causing the gate of transistor 420 to be isolated from system ground, Vss, thereby turning off transistor 420 preventing it from pulling the input signal line down to Vss. The high voltage output by buffer 430 turns on transistor 450 allowing the falling edge bias voltage to reach transistor 420. Depending upon the magnitude of the falling edge bias voltage applied to the gate of transistor 420, the impedance of transistor 420 can be adjusted. By adjusting the impedance of transistor 420, the input impedance of receiver 320 can be adjusted for falling edge signals.

Besides allowing the input impedance of receiver 320 to be controlled, transistors 410 and 420 also help charge and discharge line 405. Consequently, signal levels on line 405 can achieve a full "rail-to-rail" swing.

While in the above description only one pull-up transistor 410 was included in receiver 320, in an alternative embodiment there may be additional pull-up transistors. Similarly, an alternative embodiment may have additional pull-down transistors. While in the above description the rising edge and falling edge bias voltages are analog signals, in an alternative embodiment, the bias voltages may be transformed into digital signals which can turn on and off individual pull-up and pull-down transistors so as to control the input impedance to receiver 320. Transformation of an analog signal into a digital signal should be apparent to one of ordinary skill in the art, and is not described herein in order not to obscure the present invention. Transistors in FIG. 4 can be bipolar junction transistors, MOSFETs, JFETs or other type of transistor known in the art.

Figure 5:
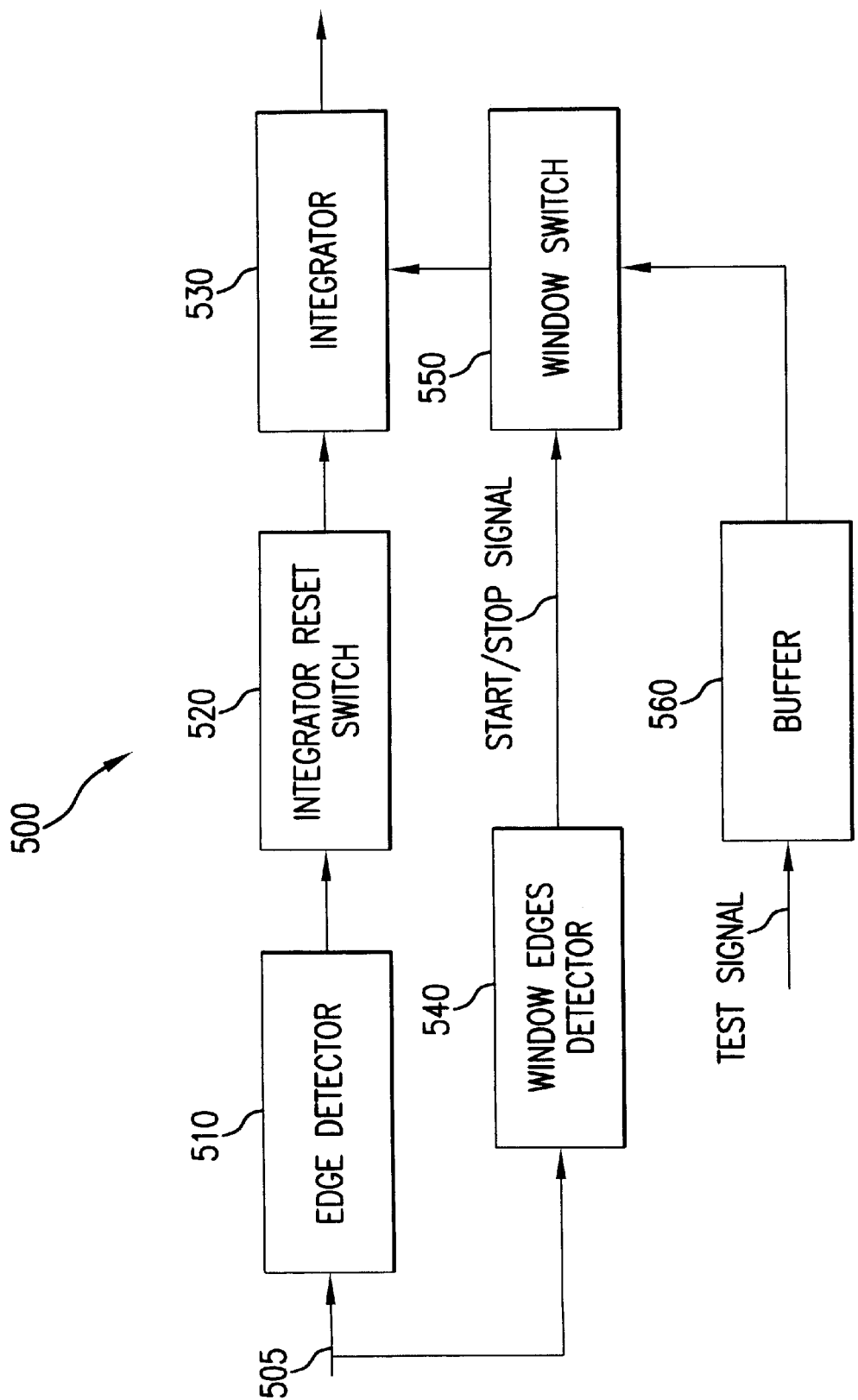
FIG. 5 illustrates a block diagram of an integrator according to an embodiment in accordance with the present invention.

FIG. 5 illustrates a block diagram of a windowed integrator in an embodiment in accordance with the present invention. Windowed integrator 500 is representative of integrators 330 and 340 of FIG. 3a. Integrator 500 includes, a reset line 505, an edge detector 510, a reset switch 520, an integrator 530, a window edges detector 540, a window switch 550, and a buffer 560. The operation of windowed integrator 500 will be described for the case where integrator 500 is a driver integrator. A receiver integrator operates in a manner similar to the driver integrator, except it receives a different signal at buffer 560. When a reset signal is received by edge detector 510 on reset line 505, edge detector 520 generates a close switch signal which is applied to switch 520 for a predetermined period of time. For the duration of the close switch signal, switch 520 causes the integrator to reset itself so that it substantially indicates a zero value. The window edges detector 540 also receives the reset signal on reset line 505. When detector 540 receives the reset signal, it closes window switch 550 for a period of time. While switch 550 is closed, the driver signal applied to buffer 560 travels through buffer 560 and switch 550 to integrator 530. Integrator 530 integrates the driver signal for as long as switch 550 is closed. When switch 550 opens, integrator 530 stops integrating the driver signal. At the cessation of integration, integrator 530 put out the input voltage described above in connection with FIG. 3a. For the case of a receiver integrator, integrator 530 would put out the output voltage described above in connection with FIG. 3a.

Figure 6:
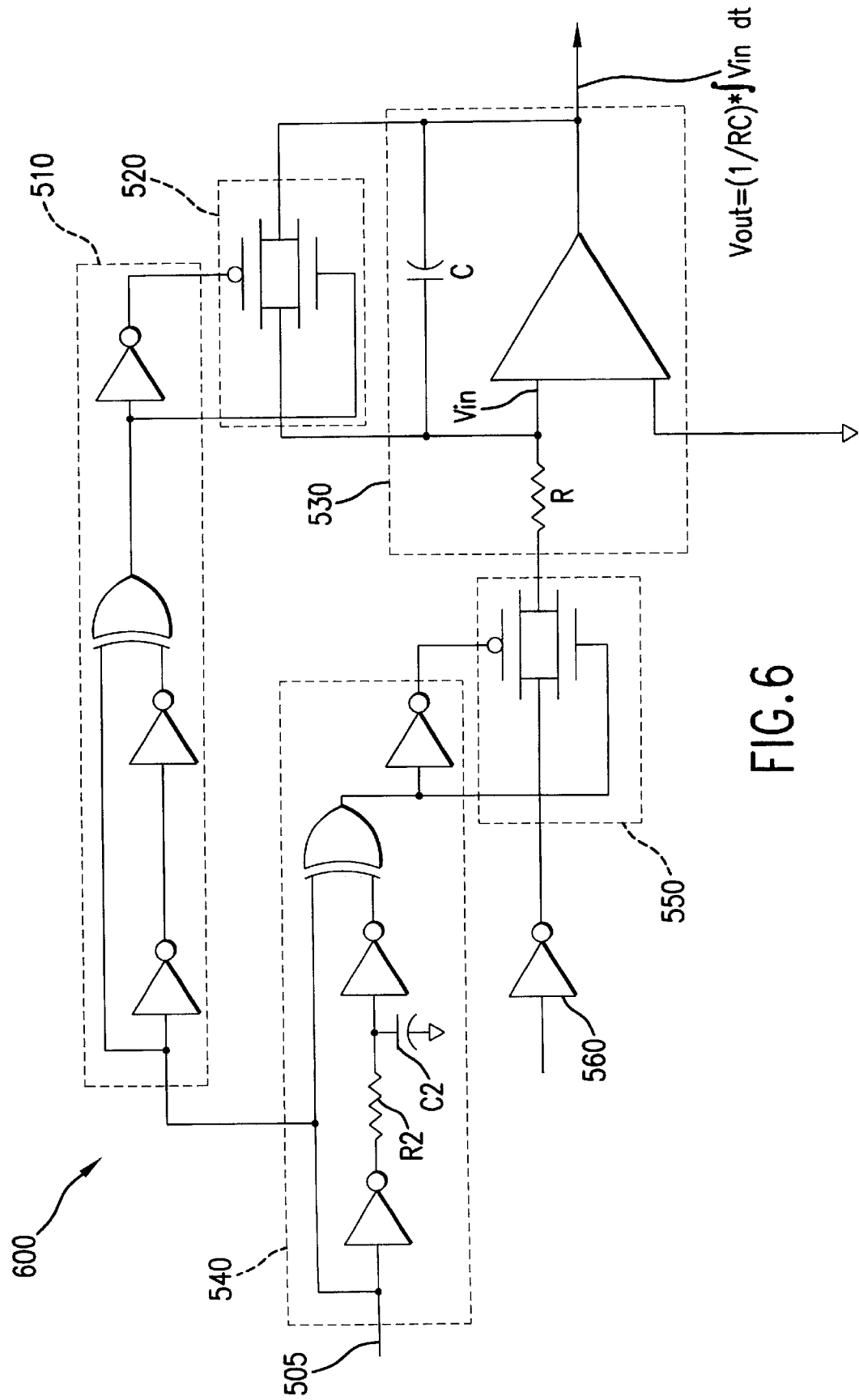
FIG. 6 illustrates an electrical diagram of an integrator according to an embodiment in accordance with the present invention.

FIG. 6 illustrates an electrical diagram of an integrator in an embodiment in accordance with the present invention. Windowed integrator 600 is an electrical diagram representation of integrators 330 and 340 of FIG. 3a. Integrator 600 includes discrete components which achieve the functionality of the block diagram representation of integrators 330 and 340, described above in connection with FIG. 5.

Figure 7:
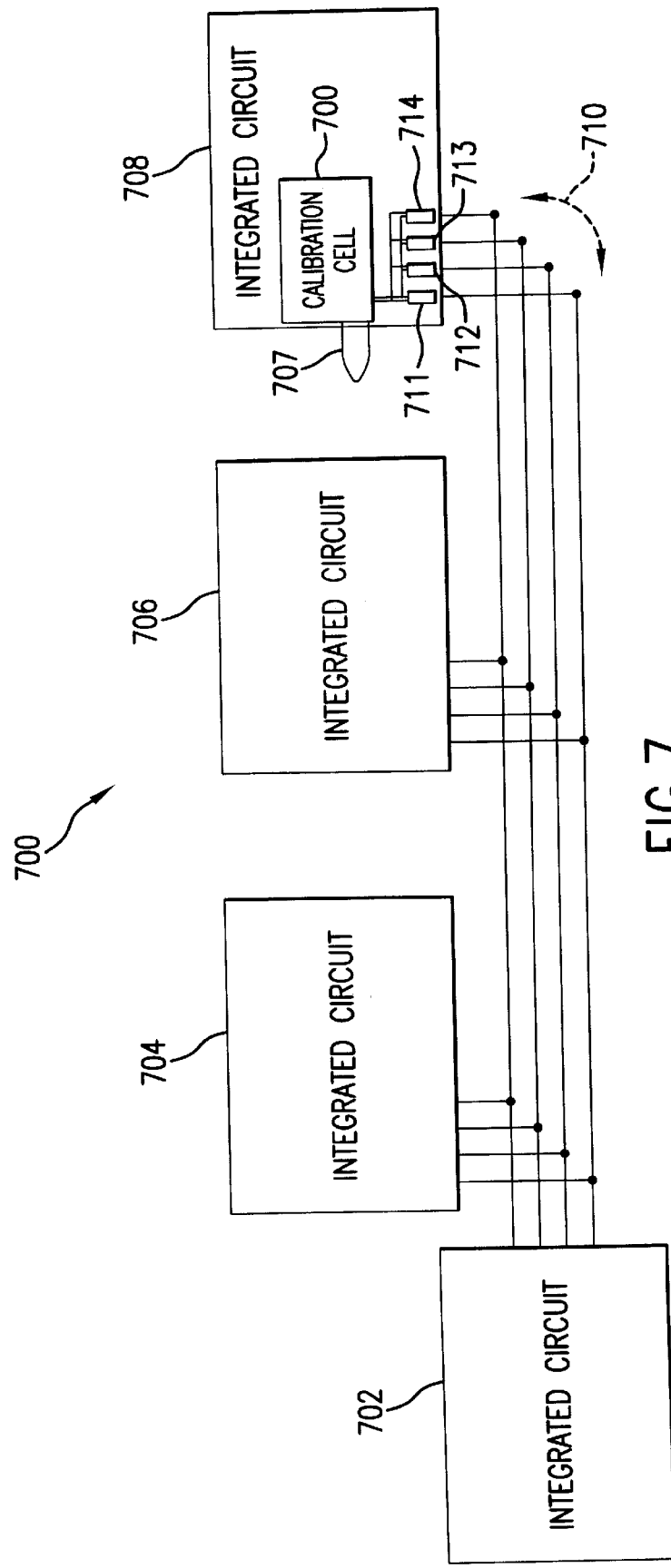
FIG. 7 illustrates a block diagram of a system including a circuit with a calibration cell in accordance with an embodiment of the present invention.

FIG. 7 illustrates a block diagram of a system including a circuit with a calibration cell in an embodiment in accordance with the present invention. System 700 includes integrated circuits 702–708 and bus 710. Integrated circuits 702–708 can be processors, read-only-memory (ROM), random-access-memory (RAM), and input/output (I/O) controllers, and other types of circuits known in the art. Bus 710 has four lines each of which is coupled to each of integrated circuits 702–708. Integrated circuits 702–708 include drivers (not shown) and receivers (not shown) which are capable of driving signals onto the lines of bus 710 and of receiving signals driven onto the lines of bus 710, respectively. Integrated circuit 708 includes a calibration cell 709 coupled to trace 707 and termination cells 711–714 each of which is coupled to one of the lines of bus 710. The description of cell 210 and trace 220 of FIG. 2a and FIG. 3a also applies to cell 709 and trace 707 and need not be repeated here. It would be appreciated by one of ordinary skill in the art that bus 710 can have more or fewer lines than the four lines shown in FIG. 7. It would also be appreciated that the termination cells may include drivers whose respective impedances are controlled in accordance with the teachings of the present invention. While only circuit 708 is shown as having a calibration cell in FIG. 7, it would be appreciated by one of ordinary skill that other circuits, including the ones shown, may have calibration cells and termination cells in alternative embodiments in accordance with the present invention.

Thus, a method and apparatus for adjusting impedance has been described. Although the present invention has been described with reference to specific exemplary embodiments, it would be appreciated by one of ordinary skill in the art that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method for adjusting an operating characteristic of a circuit on an integrated circuit, the method comprising:

generating a first signal for application to a reference termination;

generating a first voltage based on the time dependent behavior of the first signal at a first point on the reference termination;

generating a second voltage based on the time dependent behavior of the first signal at a second point on the reference termination; and reducing an impedance mismatch between the circuit and a transmission line by adjusting pull-up and pull-down impedances, independently, of the circuit based upon the first voltage and the second voltage.

2. The method of claim 1, wherein adjusting the impedances includes adjusting a buffer impedance based upon the first voltage and the second voltage.

3. The method of claim 2, wherein adjusting the impedances includes varying an analog signal applied to at least one transistor.

4. The method of claim 2, wherein adjusting the impedances includes at least one of substantially turning on and off at least one transistor.

5. The method of claim 1, further comprising:

generating a second signal for application to the reference termination;

generating a third voltage based on the second signal at a first point on the reference termination;

generating a fourth voltage based on the second signal at a second point on the reference termination; and adjusting the operating characteristic based on the third voltage and the fourth voltage.

6. A method of adjusting an operating characteristic of a circuit on an integrated circuit, the method comprising:

generating a first signal for application to a reference termination;

generating a first voltage based on the time dependent behavior of the first signal at a first point on the reference termination;

generating a second voltage based on the time dependent behavior of the first signal at a second point on the reference termination; and adjusting pull-up and pull-down impedances, independently, of the circuit based upon the first voltage and the second voltage, wherein adjusting the impedances includes adjusting a buffer impedance based on the first voltage and the second voltage, wherein generating either the first voltage or the second voltage includes integrating the first signal for a timing window having a duration less than a round trip flight-time of the first signal between the first point and the second point.

7. The method of claim 6, wherein the adjusting includes adjusting a bias voltage of a p-type MOSFET.

8. The method of claim 6, wherein the adjusting includes adjusting a bias voltage of a n-type MOSFET.

9. The method of claim 6, wherein the timing window includes a falling edge of the first signal at the first point.

10. A circuit, comprising:

a first signal generator to generate a first signal for application to a reference termination; and a bias voltage generator coupled to the first signal generator to receive a first voltage based on the first signal at a first point on the reference termination and a second voltage based on the first signal at a second point on the reference termination and to generate a bias voltage for adjusting an operating characteristic of a second circuit, wherein the operating characteristic is an impedance, the bias voltage reducing an impedance mismatch between the second circuit and a transmission line.

11. The circuit of claim 10, further comprising:

a first integrator coupled to the first signal generator to integrate the first signal at the first point on the reference termination and to generate the first voltage; and a second integrator coupled to the first signal generator to integrate the first signal at the second point on the reference termination and to generate the second voltage.

12. The circuit of claim 11, further comprising at least one variable impedance device, and wherein the bias voltage is an analog signal applied to the at least one variable impedance device.

13. The circuit of claim 11, further comprising at least one impedance device, and wherein the bias voltage substantially turns on or off in a digital manner the at least one impedance device.

14. The circuit of claim 11, wherein the first integrator integrates the first signal at the first point on the reference termination for a timing window having a duration less than a round trip flight-time of the first signal between the first point and the second point.

15. The circuit of claim 11, wherein the second integrator integrates the first signal at the second point on the reference termination for a timing window having a duration less than a round trip flight-time of the first signal between the first point and the second point.

16. The circuit of claim 10, further comprising a termination cell including at least one p-type MOSFET, and wherein the impedance is adjusted by adjusting a gate voltage of the at least one p-type MOSFET.

17. The circuit of claim 10, further comprising a termination cell including at least one n-type MOSFET, and wherein the impedance is adjusted by adjusting a gate voltage of the at least one n-type MOSFET.

18. A system, comprising:

a bus;

a first circuit coupled to the bus;

a reference termination;

a second circuit coupled to the bus and including,
a clocked first signal generator to generate a first signal for application to the reference termination; and
a bias voltage generator coupled to the first signal generator to receive a first voltage based on the first signal at a first point on the reference termination and a second voltage based on the first signal at a second point on the reference termination and to generate a bias voltage for adjusting an operating characteristic of a third circuit, wherein the operating characteristic is an impedance, the bias voltage reducing an impedance mismatch between the third circuit and the bus.

19. The system of claim 18, further comprising:

a first integrator coupled to the first signal generator to integrate the first signal at the first point on the reference termination and to generate the first voltage; and a second integrator coupled to the first signal generator to integrate the first signal at the second point on the reference termination and to generate the second voltage.

* * * * *

UNITED STATES PATENT AND TRADEMARK OFFICE
CERTIFICATE OF CORRECTION

PATENT NO. : 6,577,179 B2
DATED : June 10, 2003
INVENTOR(S) : Maynard C. Falconer It is certified that error appears in the above-identified patent and that said Letters Patent is hereby corrected as shown below:

Column 4,
Line 54, "is is described" should be -- is described --

Column 5,
Line 49, "is be before" should be -- is before --

Column 6,
Line 53, "that" should be -- that the receiver input inpedance substantially matches the impedance of PCB trace 220 when falling edge signals are placed in trace 220. --

Signed and Sealed this

Tenth Day of August, 2004

JON W. DUDAS
*Acting Director of the United States Patent and Trademark Office*